(12) United States Patent
Kymissis et al.

(10) Patent No.: US 9,863,979 B2
(45) Date of Patent: Jan. 9, 2018

(54) SYSTEMS, APPARATUS, AND METHODS FOR ENERGY MONITORING

(71) Applicant: THE TRUSTEES OF COLUMBIA UNIVERSITY IN THE CITY OF NEW YORK, New York, NY (US)

(72) Inventors: Ioannis Kymissis, New York, NY (US); Shyuan Yang, New York, NY (US); Jun Shimada, New York, NY (US); Fabio Carta, White Plains, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 204 days.

(21) Appl. No.: 14/666,044

(22) Filed: Mar. 23, 2015

(65) Prior Publication Data
US 2015/0309081 A1    Oct. 29, 2015

Related U.S. Application Data

(60) Provisional application No. 61/984,499, filed on Apr. 25, 2014.

(51) Int. Cl.
*G01R 15/18* (2006.01)
*G01R 3/00* (2006.01)
(Continued)

(52) U.S. Cl.
CPC ............. *G01R 3/00* (2013.01); *G01R 15/202* (2013.01); *G01R 15/18* (2013.01); *G01R 15/207* (2013.01);
(Continued)

(58) Field of Classification Search
CPC ......... H02J 1/00; G05B 1/00; G05B 2219/00; H04B 1/00; H04B 2201/00
See application file for complete search history.

(56) References Cited

U.S. PATENT DOCUMENTS 4,706,017 A * 11/1987 Wilson ................... G01R 15/18
324/127
5,044,980 A    9/1991 Krumme et al.
(Continued)

OTHER PUBLICATIONS

"Airborn Flexible Circuits, Inc.—Capabilities," [Online], retrieved from Internet: <http://www.strataflex.com/capabilities.php> (Accessed on Feb. 14, 2013) 2 pages.
(Continued)

*Primary Examiner* — Huy Q Phan
*Assistant Examiner* — Temilade Rhodes-Vivour
(74) *Attorney, Agent, or Firm* — Wilmer Cutler Pickering Hale and Dorr LLP

(57) ABSTRACT

An apparatus for energy auditing can include a sensor portion on a circuit substrate, the sensor portion defining a first opening, an integrated inductor on the sensor portion, the integrated inductor being formed proximal to the first opening or a hall sensor located on the sensor portion proximal to the first opening, and an electronic circuit on a body portion of the circuit substrate electrically coupled to the integrated inductor and configured to wirelessly transmit information to a wireless receiver.

19 Claims, 15 Drawing Sheets

(51) Int. Cl.
  *G01R 15/20* (2006.01)
  *G05B 1/00* (2006.01)
  *H02J 1/00* (2006.01)
  *H04B 1/00* (2006.01)
  *G01R 22/06* (2006.01)

(52) U.S. Cl.
  CPC .............. *G01R 22/063* (2013.01); *G05B 1/00* (2013.01); *H02J 1/00* (2013.01); *H04B 1/00* (2013.01)

(56) References Cited

U.S. PATENT DOCUMENTS

| | | | |
|---|---|---|---|
| 6,027,347 A | 2/2000 | Reichle | |
| 6,077,124 A | 6/2000 | Etters et al. | |
| 7,377,448 B2 | 5/2008 | Dan et al. | |
| 7,458,825 B2 | 12/2008 | Atsmon et al. | |
| 8,203,847 B2 | 6/2012 | Koh | |
| 8,564,279 B2 | 10/2013 | Johnson et al. | |
| 9,420,701 B2 | 8/2016 | Yang et al. | |
| 2003/0042796 A1* | 3/2003 | Siu .......................... | G06F 1/266 307/39 |
| 2006/0072271 A1* | 4/2006 | Jones ............... | G06K 19/07758 361/93.1 |
| 2010/0061070 A1 | 3/2010 | Koh | |
| 2010/0070217 A1* | 3/2010 | Shimada ................ | G01D 4/008 702/62 |
| 2011/0068626 A1* | 3/2011 | Terlizzi .................... | H02J 1/08 307/32 |
| 2012/0106095 A1 | 5/2012 | Daniel | |

OTHER PUBLICATIONS

Cheng, I-Chun, and Wagner, S., "Chapter 1: Overview of Flexible Electronics Technology," *Flexible Electronics*, vol. 11 of the series Electronic Materials: Science & Technology pp. 1-28.

Gergel-Hackett, N., et al., "A Flexible Solution-Processed Memristor," IEEE Electron Device Letters, vol. 30, No. 7, pp. 706-708 (Jul. 2009).

Sazonov, A., et al., "Low-Temperature Materials and Thin Film Transistors for Flexible Electronics," Proceedings of the IEEE, vol. 93, No. 8, pp. 1420-1428 (Aug. 2005).

Sekitani, T., et al., "Organic Nonvolatile Memory Transistors for Flexible Sensor Arrays," Science, vol. 326, No. 5959, pp. 1516-1519 (Dec. 11, 2009).

* cited by examiner

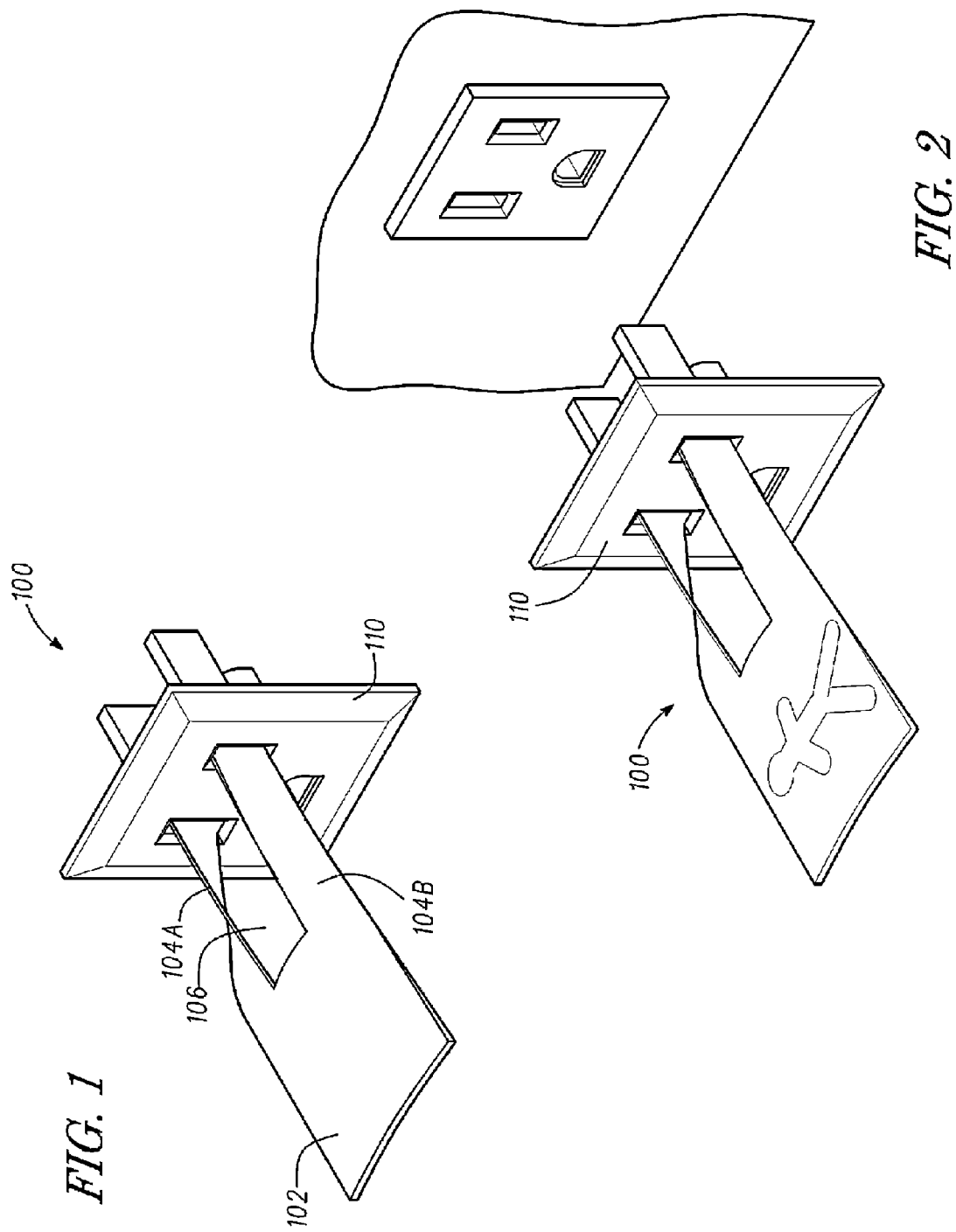

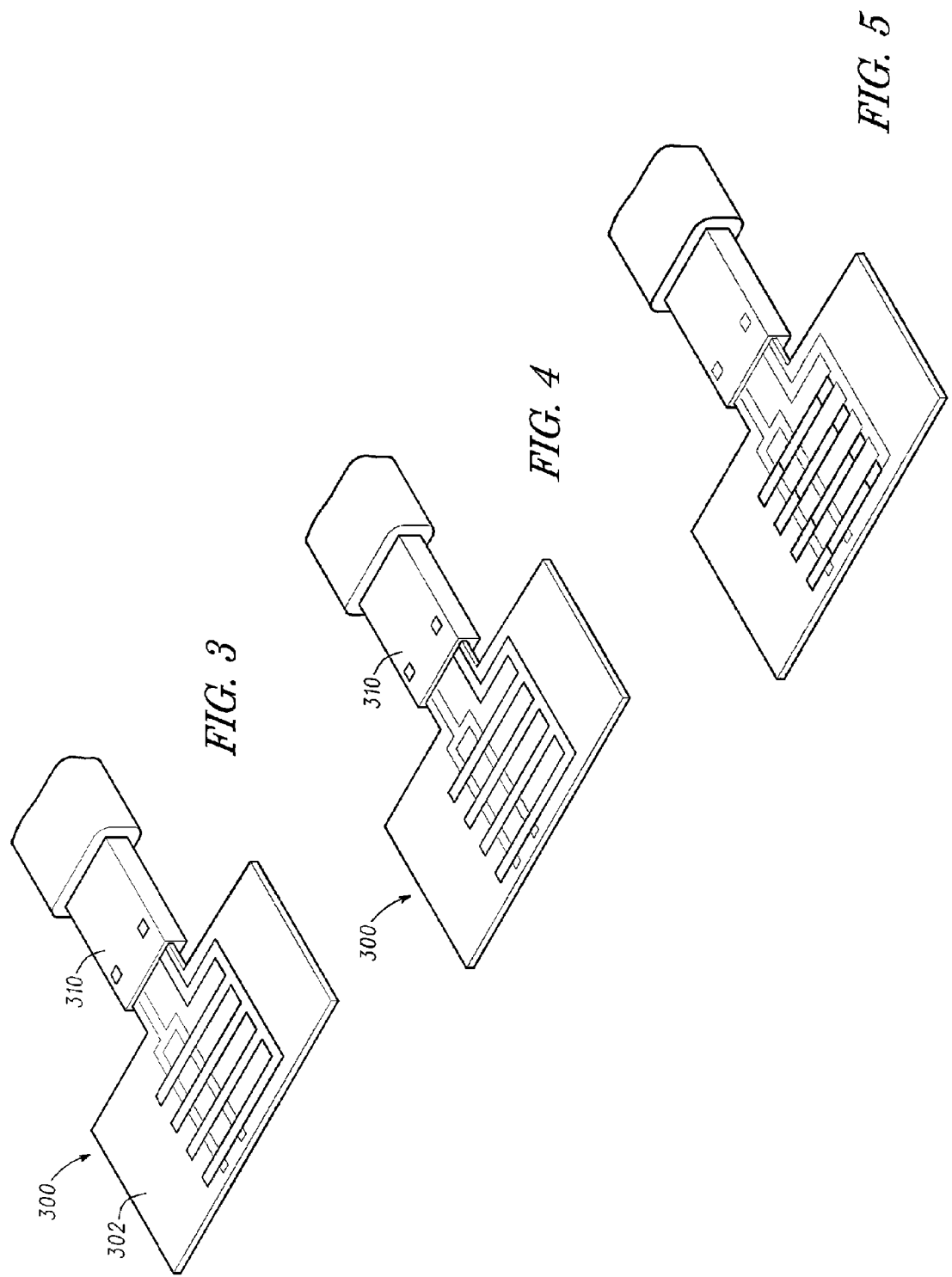

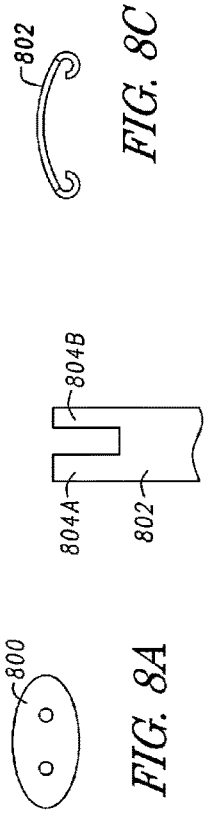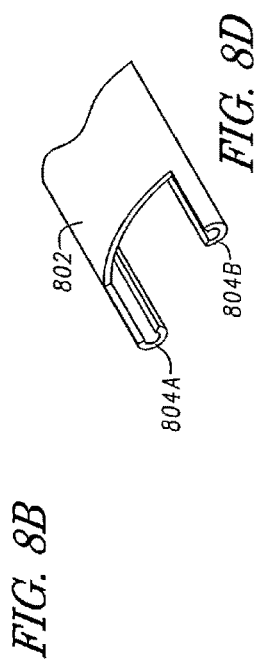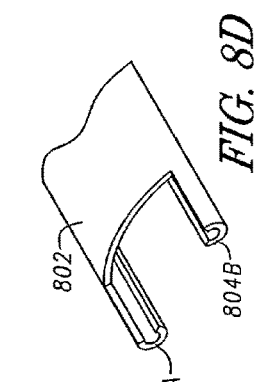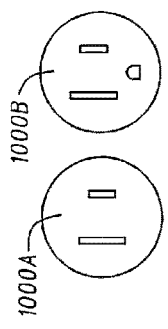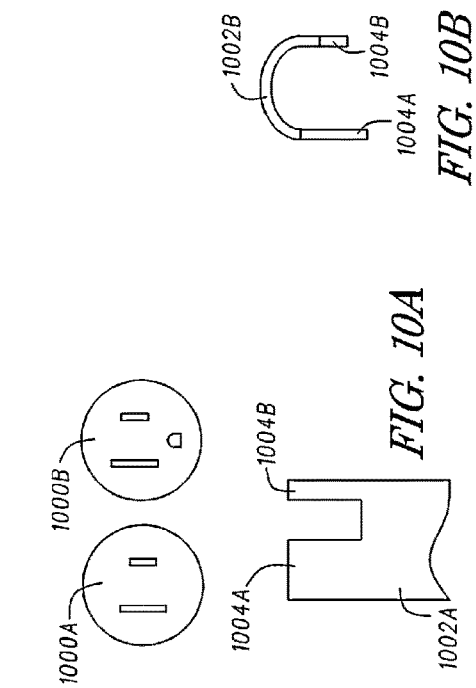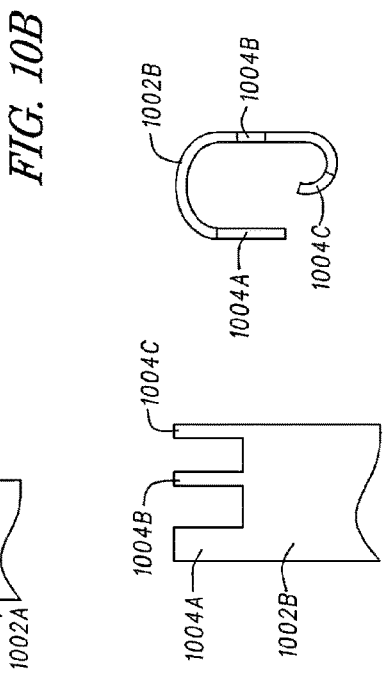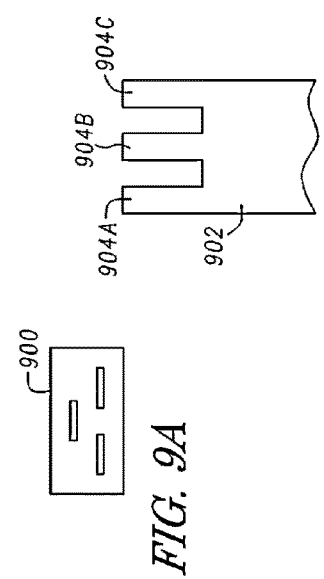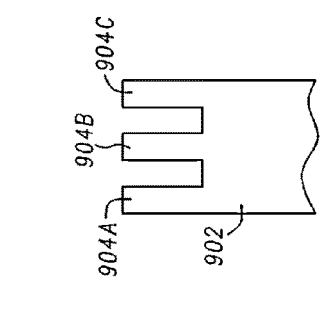

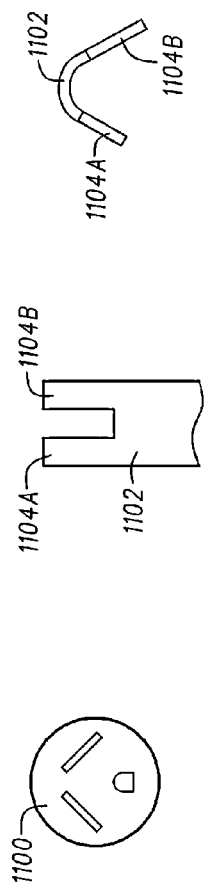
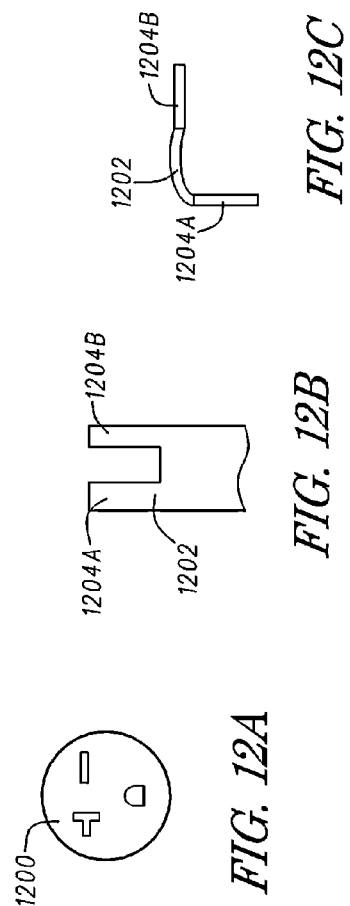

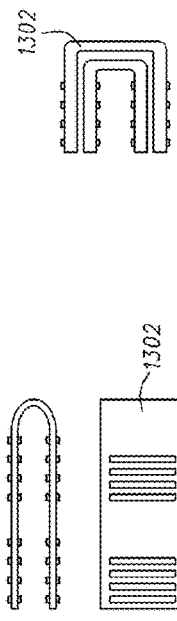
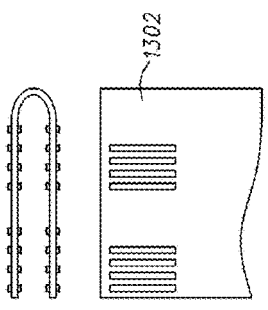
FIG. 13A  FIG. 13B  FIG. 13C  FIG. 13D
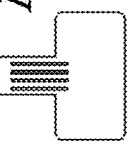
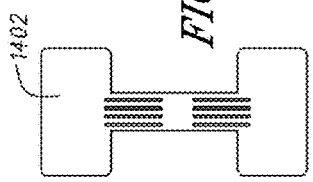
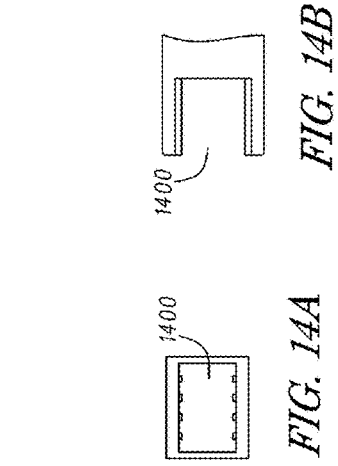
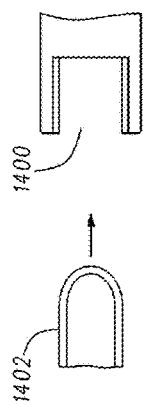
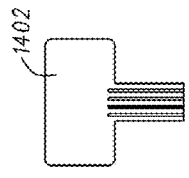
FIG. 14A  FIG. 14B  FIG. 14C  FIG. 14D  FIG. 14E  FIG. 14F

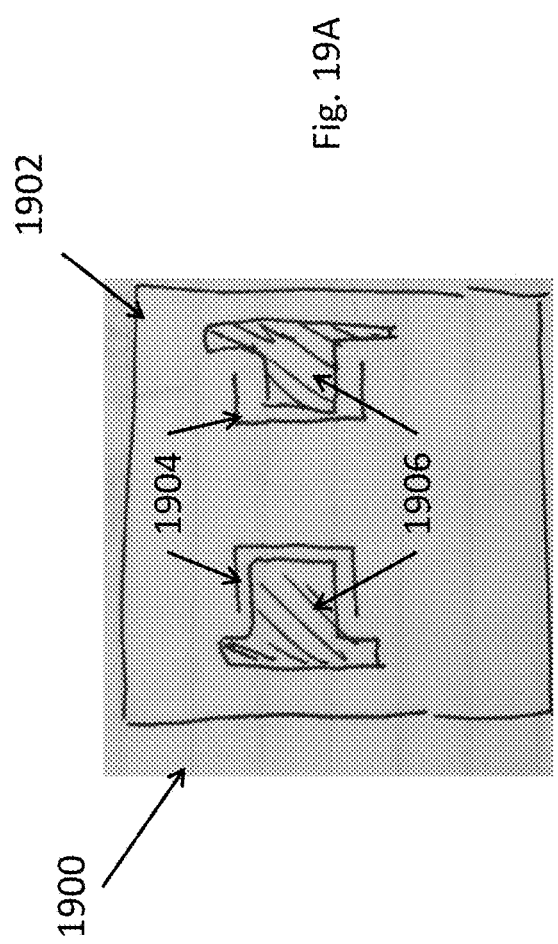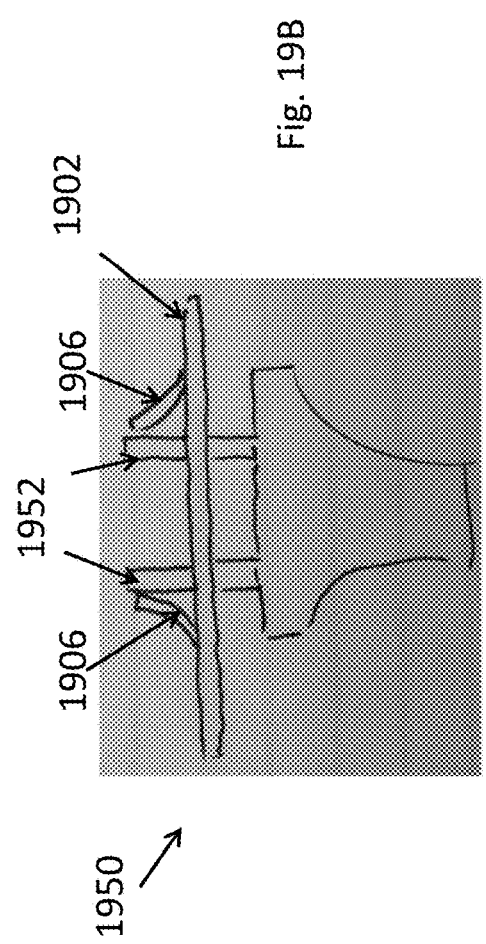

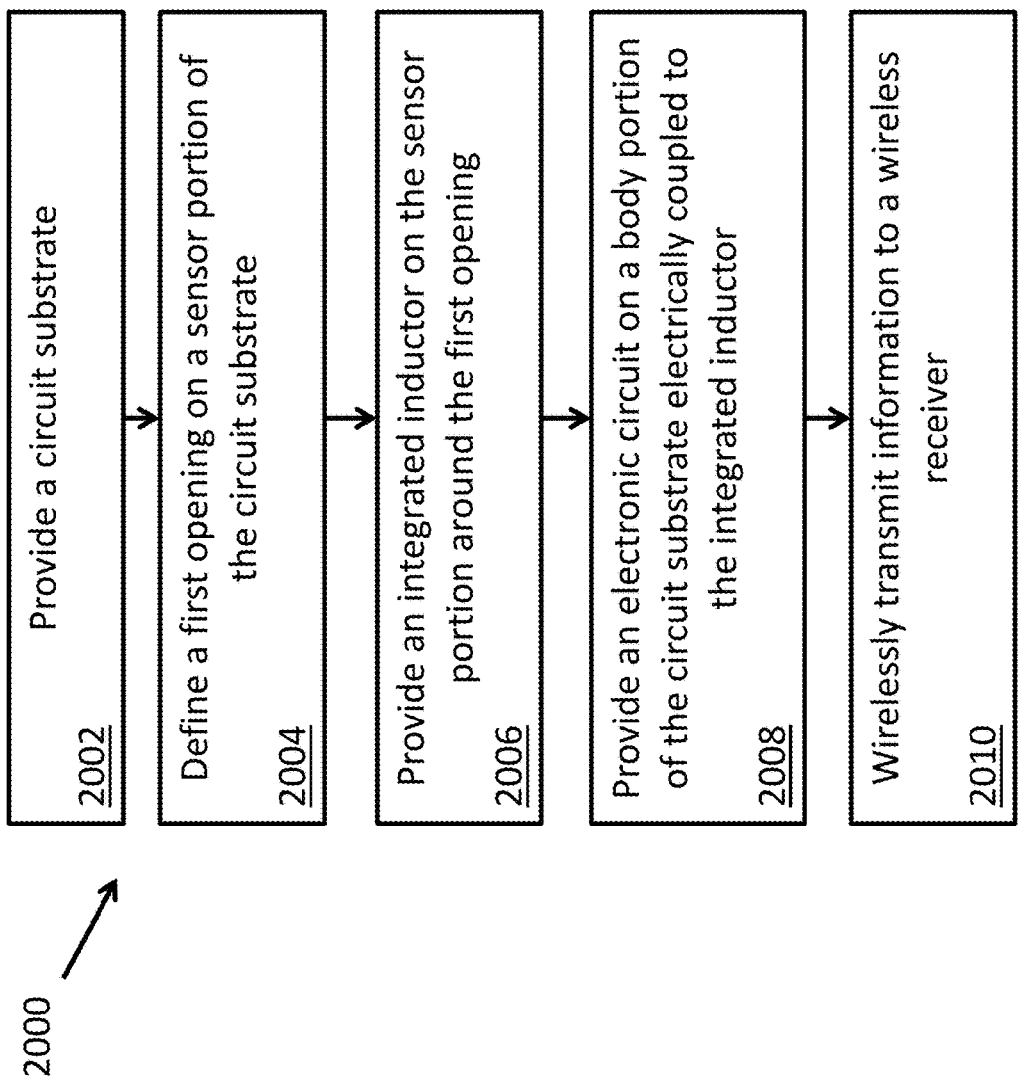

SYSTEMS, APPARATUS, AND METHODS FOR ENERGY MONITORING

CROSS-REFERENCE TO RELATED APPLICATIONS

This application claims the benefit under 35 U.S.C. §119 (e) of U.S. Provisional Patent Application No. 61/984,499, entitled "INTERPOSER-BASED DESIGN FOR ENERGY MONITORING," filed on Apr. 25, 2014, the contents of which are incorporated by reference herein in their entirety.

This application is also related to U.S. application Ser. No. 14/093,726, entitled "FLEXIBLE DIRECT OR USB PLUG-IN PLATFORM FOR FOLDABLE OR FLEXIBLE ELECTRONICS," filed on Dec. 2, 2013, which claims the benefit under 35 U.S.C. §119(e) of U.S. Provisional Patent Application No. 61/731,914, entitled "FLEXIBLE DIRECT OR USB PLUG-IN PLATFORM FOR FOLDABLE OR FLEXIBLE ELECTRONICS," filed on Nov. 30, 2012, and U.S. Provisional Patent Application No. 61/774,495, entitled "FLEXIBLE DIRECT OR USB PLUG-IN PLATFORM FOR FOLDABLE OR FLEXIBLE ELECTRONICS," filed on Mar. 7, 2013, the contents of all are hereby incorporated by reference herein in their entirety.

FIELD OF THE DISCLOSURE

This disclosure relates to systems, apparatus, and methods for monitoring energy consumption.

BACKGROUND

Flexible electronic circuits provide for assembly of electronic devices on a flexible circuit substrate. This allows for printed circuit board (PCB) assemblies that are flexible to fit into tighter spaces of electronic products to reduce the size of the finished product. This is desirable in any technology area where it is desired to reduce the size of the finished product such as personal electronic devices (e.g., cell phones) and medical devices. The present inventors have recognized a need for improvement to flexible electronic circuits to extend their application.

The present system, devices, and methods described herein relate to providing power to flexible electronic circuits by direct connection of flexible or foldable electronic circuits to a receptacle providing the circuit power. An apparatus comprises a flexible circuit substrate that includes a body portion and at least one connector portion formed monolithically with the body portion. The connector portion is shaped by at least one of one or more bends of the flexible circuit substrate or one or more folds of the flexible circuit substrate, and the connector portion is configured to be received in a receptacle of a connector device. The apparatus also includes at least one electrode formed on the connector portion and configured to make electrical contact with an electrical conductor of the receptacle of the connector device, at least one electronic component on the flexible circuit substrate, and includes interconnect to provide electrical continuity from the electrode to the electronic component.

This overview is intended to provide an overview of subject matter of the present patent application. It is not intended to provide an exclusive or exhaustive explanation of the invention. The detailed description is included to provide further information about the present patent application.

SUMMARY

According to embodiments of the present invention, an apparatus for energy audit can include a sensor portion on a circuit substrate, the sensor portion defining a first opening, an integrated inductor on the sensor portion, the integrated inductor being formed proximal to the first opening, and an electronic circuit on a body portion of the circuit substrate electrically coupled to the integrated inductor and configured to wirelessly transmit information to a wireless receiver.

According to embodiments of the present invention, an apparatus for energy audit can include a sensor portion on a circuit substrate, the sensor portion defining a first opening, a hall sensor located on the sensor portion proximal to the first opening, and an electronic circuit on a body portion of the circuit substrate electrically coupled to the hall sensor and configured to wirelessly transmit information to a wireless receiver.

According to embodiments of the present invention, a method for making an energy audit apparatus can include the steps of providing a sensor portion on a circuit substrate, the sensor portion defining a first opening, forming an integrated inductor on the sensor portion proximal to the first opening, and providing an electronic circuit on a body portion of the circuit substrate electrically coupled to the integrated inductor and configured to wirelessly transmit information to a wireless receiver.

According to embodiments of the present invention, a method for making an energy audit apparatus can include the steps of providing a sensor portion on a circuit substrate, the sensor portion defining a first opening, providing a hall sensor located on the sensor portion proximal to the first opening, and providing an electronic circuit on a body portion of the circuit substrate electrically coupled to the hall sensor and configured to wirelessly transmit information to a wireless receiver.

According to embodiments of the present invention, a system for energy auditing can include a plurality of energy auditing devices, each energy auditing devices comprising a sensor portion on a circuit substrate, the sensor portion defining a first opening, an integrated inductor on the sensor portion, the integrated inductor being formed proximal to the first opening, and an electronic circuit on a body portion of the circuit substrate electrically coupled to the integrated inductor and configured to wirelessly transmit information to a wireless receiver. The system for energy auditing can also include a base station configured to receive the information from at least one energy auditing device and analyze the received information to provide an energy audit.

According to embodiments of the present invention, a system for energy auditing can include a plurality of energy auditing devices, each energy auditing devices comprising a sensor portion on a circuit substrate, the sensor portion defining a first opening, a hall sensor located on the sensor portion proximal to the first opening, and an electronic circuit on a body portion of the circuit substrate electrically coupled to the hall sensor and configured to wirelessly transmit information to a wireless receiver. The system for energy auditing can also include a base station configured to receive the information from at least one energy auditing device and analyze the received information to provide an energy audit.

DESCRIPTION OF DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 shows an example of a flexible circuit platform that can be plugged directly into one or more receptacles, such as into the receptacles of an AC or other power outlet.

FIG. 2 shows an example in which AC power has been applied to the flexible circuit platform of FIG. 1.

FIG. 3 shows an example of a flexible circuit platform that can be plugged directly into one or more receptacles, such as into the receptacles of a Universal Serial Bus (USB).

FIGS. 4-5 show an example before (FIG. 4) and after (FIG. 5) power has been applied via the USB connector to the flexible circuit platform of FIG. 3, which can include one or more light-emitting diodes or other light-emitting components.

FIGS. 8A, 8B, 8C, and 8D show portions of an example of a flexible circuit platform that can be received directly into a connector device having multiple receptacles.

FIGS. 9A-C, 10A-C, 11A-C, and 12A-C show portions of further examples of a flexible circuit platform that can be received directly into a connector device having multiple receptacles.

FIGS. 13A, 13B, 13C, and 13D show portions of an example of a flexible circuit platform that can be received directly into a connector device having a receptacle that includes a center post and an inside periphery.

FIGS. 14A-F show portions of an example of a flexible circuit platform that can be received directly into a connector device including rectangular volume receptacle.

FIGS. 19A-B show an exemplary implementation an energy monitor that can be powered through an outlet, according to aspects of the present disclosure.

FIG. 20 shows an exemplary method for making an apparatus for energy monitoring.

DETAILED DESCRIPTION

Figure 6A:
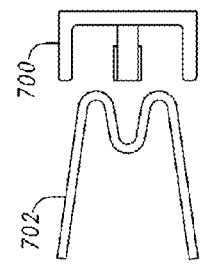
FIGS. 6A, 6B, and 6C show portions of an example of a flexible circuit platform that can be received directly into a receptacle of a connector device, such as a jack plug type receptacle.

Flexible electronic circuits or flex circuits are emerging as an industry with wide-reaching applications. Systems, devices, and methods are described herein that extend the application of flexible electronic circuits by providing a direct interface between the flexible electronics circuit and interfaces such as, among other things, a USB receptacle, an alternating current (AC) power receptacle, an audio or video jack plug receptacle, and a display port receptacle. This allows for an expansion of the types of flexible electronic devices that can be made available, reduces the cost of electronic circuits, and allows at least portions of such systems and devices to be biodegradable.

FIG. 1 shows an example of a flexible circuit platform having a flexible circuit substrate that includes a body portion and a connector portion. The flexible circuit platform 100 in the example can be configured to plug directly into one or more receptacles, such as into the receptacles of a connector device such as an AC power outlet or other power outlet. The example of FIG. 1 shows a flexible circuit substrate configured to plug into the receptacles of a standard 110 Volt wall outlet 110. The flexible circuit substrate can include a main portion or body portion 102 and at least one connector portion. In the example of FIG. 1, two connector portions are formed into two electrode appendages 104A-B. At least one electrode is formed on a connector portion to allow the electrode appendage to make electrical contact with an electrical conductor of the receptacle of the connector device. In certain examples, the connector portions are configured as appendages to be received in the receptacle of an AC connector device that meets a National Electrical Manufactures Association (NEMA) standard.

The electrode appendages 104 can protrude out from the body portion 102. For example, the electrode appendages 104A-B can be formed as part of a flexible planar main body, and a cutout region 106 therebetween can be provided to separate the appendages. The cutout region 106 can leave enough space between the electrode appendages 104A-B such that the electrode appendages 104A-B can be flexed into an orientation that is not coplanar with the body portion 102. In variations, the electrode appendages 104A-B can be flexed approximately orthogonal to their original orientation that was coplanar to the body portion 102. Such bending of the electrode appendages 104A-B can be accompanied by some flexing of the body portion 102.

The material used for the electrode appendages 104A-B and the body portion 102 can be flexible enough to accommodate this flexing of the electrode appendages 104A-B into the orthogonal orientation from the original orientation, such as to accommodate directly plugging in the electrode appendages 104A-B into the vertically-oriented and horizontally spaced-apart receptacles of the standard power outlet 110 of the example of FIG. 1. The flexible circuit platform 100 can use the present principles to be additionally or alternatively configured or adapted for direct plug-in to one or more other power outlets or one or more other connectors. One or both of the electrode appendages 104A-B can also be sized, shaped, positioned, or otherwise configured to be long enough and flexible enough to be folded back over itself (e.g., back toward the body portion 102), and resilient enough such that the folded-over sections can be pushed toward one or both internal edges of the corresponding receptacle of the power outlet 110. The folding or bending can help provide a restoring force or a mechanical bias to promote or ensure mechanical and electrical contact between an electrical conductor in or on the electrode appendages 104A-B and an electrical conductor in the receptacle of the power outlet 110, respectively.

In some examples, the body portion 102 and the electrode appendages 104A-B can both be formed from the same unitary or monolithic flexible substrate. The flexible substrate can include an insulating material (e.g., among other things, polyethylene naphthalate (PEN), polyethylene terephthalate (PET), paper, etc.). A metal or other conductive material can be formed or patterned on the insulating material, such as using, among other things, one or more of thermal evaporation, electroplating, electrochemistry, lithography, and laser patterning. The metal or other conductive material can be used to form the electrodes of the appendages. This allows the appendages 104A-B to serve as blade plugs for a corresponding receptacle of an AC power connector or other type connector.

In certain examples, the body portion 102 can include, or can be monolithically integrated with, a flexible electronic circuit that can include or support one or more organic or inorganic electronic, optoelectronic, optical, mechanical, or other components. In some variations, one or more integrated circuit (IC) components can be integrated with the body portion 102 of the flexible circuit platform 100, such as by using a bonding technique, a flip-chip bonding technique, or other mounting technique. In some variations an electronic circuit component can be formed in layers of one or both of the body portion and the connector portion of the flexible circuit substrate. A metal or other conductive material can be formed to provide conductive interconnect leading from the electrodes of the appendages to the body portion 102. The device in the example of FIG. 1 can provide a flexible direct plug-in platform that can be used as an interface between the power outlet 110 and electronics or one or more other components that can be included in or mounted or coupled to platform 100, such as to the main body 102 or to one or more of the electrode appendages 104A-B of the flexible platform 100. The device can provide an electronic assembly that includes cost-efficient, disposable, and/or biodegradable electronic or other devices.

FIG. 2 shows an example in which AC power has been applied to a flexible circuit platform 100, such as a flexible circuit platform described in regard to FIG. 1. The flexible circuit platform 100 includes one or more light-emitting diodes (LEDs) or other light-emitting components to create a display that is powered using the power outlet 110. In variations, the flexible platform can include organic or inorganic passive electronic components, active electronic components (e.g., transistors or memory cells), or mechanical components. Among other things, the example of FIG. 2 demonstrates use of the flexible circuit platform 100 that integrates both electrodes and electronic components, and can eliminate a need for using any intermediate electronic adapter devices between a flexible electronic circuit and an AC power outlet or other connector.

FIG. 3 shows an example of a flexible circuit platform 300 that can be configured to plug directly into one or more receptacles, such as into the receptacle of a USB connector 310, such as shown in the example of FIG. 3. The platform has a flexible circuit substrate that can include a body portion 302 and one or two or more connector portions formed into electrode appendages 304 or pins. The electrode appendages 304 can protrude out from the body portion 302 to be received by the USB receptacle. For example, the electrode appendages 304 can be formed as part of a flexible planar body portion 302, and can be sized and shaped to fit within the receptacle of a USB connector 310. The electrode appendages 304 can include one or more patterned conductors that are adapted to align with, contact, and conduct one or more signals using corresponding conductors within the receptacle of the USB connector 310. The electrode appendages 304 can have different lengths to match pin lengths of a standard USB interface.

The flexible circuit platform 300 can use the present principles to be additionally or alternatively configured or adapted for direct plug-in to one or more other connectors or power outlets. For example, the flexible circuit platform 300 can include one or more appendages 104A-B configured for direct plug-in to corresponding one or more receptacles of a standard AC power outlet 110 in addition to including one or more appendages 304 configured for direct plug-in to corresponding one or more receptacles of one or more USB connectors 310.

The electrode appendage 304 can also be sized, shaped, or otherwise configured to be long enough and flexible enough to be folded back over itself, e.g., back toward the body portion 302, and resilient enough such that the folded-over portion can be pushed toward one or both internal edges of the corresponding receptacle of the USB connector 310. This can help provide mechanical biasing to promote or ensure mechanical and electrical contact between one or more electrical power or other electrical signal conductors in or on the electrode appendage 304 and a corresponding one or more electrical conductors in the receptacle of the USB connector 310, respectively. A metal or other conductive material can be formed on the appendages to form pins for insertion into the USB interface to provide conductive interconnect leading from the electrodes of the appendages to the body portion 302.

In some examples, the body portion 302 and the electrode appendages 304A-B can both be formed from the same unitary flexible substrate. A metal or other conductive material can be formed or patterned on the insulating material, such as using, among other things, one or more of thermal evaporation, electroplating, or laser patterning. The body portion 302 can include or be monolithically integrated with a flexible electronic circuit that can include or support one or more organic or inorganic electronic, optoelectronic, optical, mechanical, or other components. For example, one or more integrated circuit die components can be integrated with the body portion 302 of the platform 300, such as using a flip-chip bonding or other mounting technique.

The flexible circuit platform 300 can be used as a direct interface between the USB connector 310 and electronics or one or more other components that can be included in or mounted or coupled to flexible circuit platform 300, such as to the body portion 302 or to the electrode appendage 304 of the flexible circuit platform 300. An example of an application can include cost-efficient disposable or biodegradable electronic or other devices.

FIGS. 4-5 show an example before (FIG. 4) and after (FIG. 5) power has been applied via the USB connector 310 to the flexible circuit platform 300, which can include one or more light-emitting diodes or other light-emitting components, such as shown in use in the example of FIGS. 4-5. Among other things, the example of FIGS. 4-5 demonstrates use of the flexible circuit platform 300 that can eliminate a need for using intermediate electronic adapter devices between a flexible circuit and an AC power outlet or other connector.

Figure 6B:
Figure 6C:
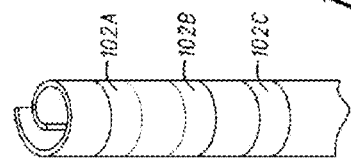

FIGS. 6A, 6B, and 6C show portions of an example of a flexible platform 100 that can be configured to plug directly into one or more types of receptacle, such as into an audio or video jack plug connector type receptacle. The flexible circuit platform 100 includes a flexible circuit substrate having a body portion and a connector portion. The connector portion is shown in the example and FIG. 6A shows a lateral view of the connector portion while it is still substantially planar prior to forming. The connector portion can include at least one bend to form (e.g., roll) the platform into a substantial cylindrical shape to form a plug for the receptacle of a connector device. The substantially cylindrical shape may have a completely cylindrical shape, or may have a cross section that is not completely circular (as shown in the example of an end view of a rolled up connector portion in FIG. 6B), or may have a seam lengthwise along the cylindrical shape, or may have a slight opening lengthwise along the cylindrical shape circular (as shown in the example of a lateral view of a rolled up connector portion in FIG. 6C). In certain examples, the diameter of the cross section of the formed plug connector is about 3.5 millimeters (mm).

The connector portion can include one, two, three, or more electrically conductive contact traces, such as contacts 102A, 102B, and 102C. The conductive traces can include transverse portions that can be spaced apart so as to make contact with corresponding individual contacts respectively located at different depths within the receptacle when the connector portion of the flexible circuit substrate is rolled up, such as shown in FIGS. 6B and 6C. The transverse portions can be located at or near a distal end of the flexible circuit substrate and can be electrically connected to respective electrically conductive contact traces extending therefrom, such as in a proximal direction (e.g., such as shown in FIG. 6A). The connector portion can be formed so that the transverse portions of the electrically conductive traces are exposed as ring type electrodes for contact with conductors of the plug receptacle. The number and location of the arranged ring electrodes can be used for, among other things, a headphone connection, a microphone connection, and a video connection.

Figure 7A:
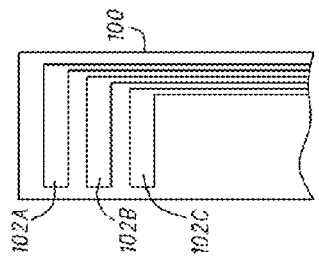
FIGS. 7A, 7B, and 7C show portions of an example of a flexible circuit platform that can be received directly into a receptacle having a center-post, such as for a receptacle of a universal serial bus standard B connector device.
Figure 7B:
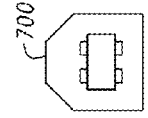
Figure 7C:
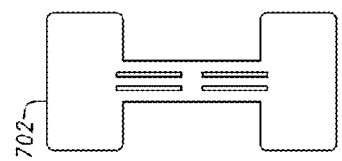

FIG. 7A shows portions of an example of a center-post receptacle, such as for a receptacle of a universal serial bus standard B (USB-B) connector device 700. FIGS. 7B and 7C show an example of a flexible circuit substrate that can be configured to plug directly into the USB-B or other center-post receptacle 700. The flexible circuit substrate can be sized, shaped, or otherwise configured to include a connector portion and a body portion 702 at one or both ends of the flexible circuit substrate. The flexible circuit substrate can optionally include a "dog bone" or other shape, as desired, such as shown in the unfolded side view of FIG. 7B. The example in FIG. 7B includes a body portion at both ends of the flexible circuit substrate and one or both of the body portions can accommodate inclusion or placement of one or more electronic components in or onto the flexible circuit substrate.

The connector portion includes a plurality of folds to form an appendage that fits within the connector device and extends outward from the body portion of the flexible circuit substrate for arrangement over the center post receptacle of the connector device. In the example shown in FIG. 7C, the connector portion has been folded into a "W" shape. The connector portion includes electrically conductive traces. The electrically conductive traces have exposed regions that can be sized, shaped, positioned, or otherwise configured to form electrodes for electrical contact with electrodes arranged on the center post receptacle of the connector device. The connector portion is flexible enough to accommodate insertion of the center-post of the receptacle into a folded region (e.g., the center of the "W"), and is stiff enough to provide a restorative force to bias the electrodes of the connector portion of the flexible circuit substrate against the electrodes of the receptacle for mechanical and electrical contact. The exposed portions of the connector portion can be configured to contact electrodes located on multiples sides of the center post receptacle, such as on the top and bottom of center post of the receptacle 700 as shown in the example of FIGS. 7A and 7C.

FIG. 8A illustrates an example of a connector device that can include multiple receptacles, such as multiple cylindrical receptacles, which can be co-linearly arranged. In some examples, the connector device meets an International Electrotechnical Commission (IEC) standard such as in an IEC C1 or C2 connector 800 as shown in FIG. 8A. FIG. 8B shows a planar (e.g., unrolled) flexible circuit substrate having a body portion 802 and connector portions 804A-B that can be formed into electrode appendages. Each of the connector portions 804A-B can include a lateral bend about a longitudinal axis of the connector portion to roll a connector portion or to form a substantially cylindrical shape, such as shown in FIGS. 8C and 8D. The cylindrical shape is configured to be received over a receptacle of a plurality of receptacles of the connector device (e.g., by sliding over the receptacles).

Electrodes of metal or another conductive material may be formed on the appendages before or after shaping to form electrodes. The body portion 820 may also include a lateral bend to form a curved body portion as shown in the examples of FIGS. 8C and 8D. FIGS. 8A-8C show an example of a connector device having two receptacles. Other examples include a flexible circuit substrate shaped to include three electrode appendages to be received by a connector device with three cylindrical receptacles. The receptacles and electrode appendages may be offset, such as by the two outside receptacles being co-linear and a center receptacle offset from the plane of the two outside receptacles.

FIG. 9A illustrates an example of a connector device that can include multiple receptacles, such as multiple rectangular volume receptacles that can have an arrangement of receptacles that is a combination of co-linear and offset receptacles, such as an IEC C19 or C20 connector 900 as shown in FIG. 9A. FIG. 9B shows a planar (e.g., unrolled) flexible circuit substrate having a body portion 902 and connector portions 904A-C that extend away from the flexible circuit substrate. The connector portions can be formed into electrode appendages that are flat or unrolled. The flexible circuit substrate includes one or more lateral bends about a longitudinal axis of the flexible circuit substrate to position the plurality of connector portions to be received by a plurality of receptacles of the connector device, such as shown in FIG. 9C. In variations, only the body portion 902 includes the lateral bend. The electrode appendages 904A, 904B, 904C that can be sized, shaped, positioned, or otherwise configured to respectively electrically contact corresponding electrical contacts in the receptacles of the connector 900. A metal or other conductive material can be included in the electrode appendages 904A, 904B, and 904C to form plug-in blades for insertion into the receptacles of the connector 900.

FIG. 10A illustrates an example of a connector device that can include multiple receptacles, such as multiple rectangular volume receptacles. The rectangular volume receptacles can be arranged co-linear in a direction orthogonal to an elongation direction of the receptacles. In some examples, the connector device is a plug receptacle that meets an NEMA standard for an AC power receptacle. FIG. 10A illustrates a two-terminal example 1000A that can be a NEMA 1-15 receptacle. FIG. 10B illustrates a three-terminal example 1000B that can be a NEMA 5-15 receptacle. The three-terminal example 1000B can include an offset third terminal that can be somewhat rounded or cylindrical, instead of a rectangular volume.

FIGS. 10A-B show an example of forming a flexible circuit substrate to have appendages that can be received into the receptacles of the two-terminal example 1000A. FIG. 10A shows a planar (e.g., unrolled) flexible circuit substrate having a body portion 1002A and connector portions 1004A-B that extend away from the flexible circuit substrate. The connector portions can be formed into electrode appendages that are flat or unrolled. The flexible circuit substrate includes one or more lateral bends about a longitudinal axis of the flexible circuit substrate to position the plurality of connector portions to be received by a plurality of receptacles of the connector device, such as shown in FIG. 10B. In variations, only the body portion 1002B includes the lateral bend. The connector portions 1004A-B can include electrically conductive contact portions and that can be sized, shaped, positioned, or otherwise configured to respectively electrically contact corresponding electrical contacts in the receptacles of the connector device 1000A.

FIG. 10C shows an example of forming a flexible circuit substrate to include appendages to be received into the receptacles of the three-terminal example 1000B. The connector portions can be formed into two electrode appendages 1004A-B that are flat or unrolled and a third electrode appendage 1004C that is bent or rolled to form an electrode appendage that can be rounded or cylindrical for insertion into the third terminal of the connector device 1000B. One or more of the body portion 1002B and the connector portions may include one or more bends to position the electrode appendages to match one or both of the position and shape of the receptacles of the connector device 1000B.

FIG. 11A illustrates an example of a connector device 1100 that can include multiple receptacles, such as multiple rectangular volume receptacles, which can be arranged co-linearly but oriented at an angle thereto, such as shown in FIG. 11A. The connector device 1100 can optionally additionally include a third receptacle, such as offset from the other receptacles to form a third vertex of a triangular arrangement, such as a NEMA TT-30 connector.

A planar or unrolled flexible circuit substrate shown in FIG. 11B can include a body portion 1102 and electrode appendages 1104A, 1104B, and optionally a third electrode appendage 1104C. FIG. 11C shows that the flexible circuit substrate can include one or more lateral bends about a longitudinal axis of the flexible circuit substrate to position the electrode appendages to correspond to the receptacles of the connector device 1100. In variations, the flexible circuit substrate can include a third appendage that can be rolled or bent to form a third electrode appendage that can be rounded or cylindrical for insertion into the third terminal of the connector device 1100. A metal or other conductive material can be included in the electrode appendages to form plug-in blades for insertion into the receptacles of the connector device 1100.

FIG. 12A illustrates an example of a connector device 1200 that can include multiple receptacles. The receptacles can be at least partially rectangular volume receptacles, and can be arranged co-linearly but oriented orthogonally to each other, such as shown in FIG. 12A. The connector device 1200 can optionally additionally include a third receptacle, such as offset from the other receptacles to form a third vertex of a triangular arrangement, such as a NEMA 6-20 connector.

FIG. 12B shows an example of a flexible circuit platform that includes a body portion 1202 and includes connector portions 1204A-B. The flexible circuit substrate can optionally include a third connector portion (not shown). The connector portions can be formed into two electrode appendages and optionally a third electrode appendage. FIG. 12C shows that the flexible circuit substrate can include one or more lateral bends about a longitudinal axis of the flexible circuit substrate to position the electrode appendages 1204A-B to correspond to the receptacles of the connector device 1200. In variations, the flexible circuit substrate includes the third appendage that can be formed to be rounded or substantially cylindrical for insertion into the third terminal of the connector device 1200.

FIG. 13A illustrates portions of an example of a connector device 1300 that includes a receptacle having a center post and an inside periphery, such as a mini display port type connector for example. The connector device 1300 can include individual electrical contacts that can be located on the center post and on the inner wall portions of the connector device 1300. FIG. 13B shows an example of a flexible circuit substrate 1302 that is flat or unfolded. The flexible circuit substrate includes a connector portion and a body portion. The connector portion is shown in FIGS. 13B-D. The body portion may include one or more electronic components bonded to, or formed monolithic to the flexible circuit substrate. The connector portion includes electrically conductive traces. The electrically conductive traces have exposed regions that can be sized, shaped, positioned, or otherwise configured to form electrodes for electrical contact with the individual electrical contacts arranged on the center post receptacle of the connector device.

The flexible circuit substrate can be constructed to be flexible enough, and with electrically conductive electrodes placed so as to align with and respectively electrically contact corresponding electrical contacts of the receptacle 1300, such as when the flexible circuit substrate is folded once, such as shown in FIG. 13C. In variations, the fold includes two ninety-degree bends to match the shape of the connector device 1300. In some examples, the flexible circuit substrate is folded twice as shown in FIG. 13D. The flexible circuit substrate may be thinner in the example of FIG. 13D than the example of FIG. 13C to accommodate the clearance inside the connector device 1300. In some examples, the folded flexible substrate of FIG. 13D provides a restorative force to bias the electrodes of the connector portion to the electrical contacts located on the center post and on the inner wall portions of the connector device 1300.

FIG. 14A illustrates an example of an end view of a connector device including a single rectangular volume receptacle 1400 (e.g., a box-shaped receptacle) with multiple electrode contacts arranged on one or more interior walls of the receptacle 1400, such as on opposing faces thereof. FIG. 14B shows a sectional side view of the connector device.

FIG. 14C shows an example of a side view of an unfolded flexible circuit substrate. The flexible circuit substrate can be sized, shaped, or otherwise configured to include a connector portion and a body portion 1402 at one or both ends of the flexible circuit substrate. The flexible circuit substrate can optionally include a "dog bone" shape or other suitable configuration, as desired. The body portion or portions can include or receive one or more electronic components. The connector portion includes electrically conductive traces. The electrically conductive traces can have exposed regions that can be sized, shaped, positioned, or otherwise configured to form electrodes for electrical contact with electrodes arranged on the one or more interior walls of the inside periphery of receptacle 1400. The conductive traces may be discontinuous from one end of the connector portion to the other. The conductive traces may provide electrical continuity to electronic components of the body portion or portions.

FIG. 14D shows a side view of the flexible circuit substrate when folded. The connector portion of the flexible circuit substrate includes at least one bend or fold to form an appendage that extends outward from the flexible circuit substrate. The appendage is configured by one or more of shape, size, and flexibility to be received by the rectangular volume receptacle of the connector device. FIG. 14E shows a sectional side view of the flexible circuit substrate when folded for insertion into the receptacle 1400, such as shown in the sectional side view of FIG. 14F. The electrodes on the connector portion are positioned to be aligned with corresponding electrical contacts within the receptacle 1400. The connector portion may include a restorative force to bias the electrodes of the connector portion against the electrical contacts within the receptacle 1400.

A method of making a flexible direct plug-in platform for integrated flexible electronic devices can include forming a monolithic flexible circuit substrate having a body portion and at least one connector portion. The flexible substrate can include an insulating material such as, among other things, PEN, PET, and paper. At least one electrode can be formed in the connector portion. The electrode or electrodes provide electrical contact with an electrical conductor or contact of a receptacle of a connector device. The electrodes can include a metal or other conductive material formed or patterned on the insulating material, such as by using, among other things, one or more of thermal evaporation, electroplating, electrochemistry, lithography, and laser patterning. The connector device can include, among other things, an AC power outlet, a USB port, a mini display port, or an audio or video jack plug receptacle.

Electrically conductive interconnect can be formed on the flexible circuit substrate to provide electrical continuity from the electrodes to an electronic component provided on the flexible circuit substrate. The electrically conductive interconnect can be formed of a metal or other conductive material formed or patterned on the insulating material, such as by using, among other things, one or more of thermal evaporation, electroplating, electrochemistry, lithography, and laser patterning.

One or both of the body portion or connector portion can include a component such as one or more organic or inorganic electronic, optoelectronic, optical, mechanical, or other components arranged on the flexible circuit substrate. One or more electronic components can be formed monolithically with the flexible substrate and can be composed of one or more layers of the flexible circuit substrate. The electronic component can be an active component (such as, among other things, a transistor, at least a portion of memory, or a light emitting component), or a passive component (such as, among other things, a capacitor, an inductor, or resistor). The flexible circuit substrate can include bonding pads to receive an electronic component (e.g., an integrated circuit) that is mounted using one or more of a bonding technique, a flip-chip bonding technique, or other mounting technique.

The method can further include shaping the at least one connector portion, such as by at least one of bending the flexible circuit substrate or folding the flexible circuit substrate for example. The shaping configures the connector portion for receiving by a receptacle of the connector device. In some examples, the shaping of the at least one connector portion includes one or more of folding, bending, and rolling a plurality of connector portions to form a plurality of appendages that extend outward from the body portion of the flexible circuit substrate. The appendages can be electrode appendages to be received in the receptacle of the connector device.

In some examples, shaping the at least one connector portion includes laterally bending a plurality of connector portions about a longitudinal axis of the connector portions to form a plurality of substantially cylindrical shaped connector portions. The substantially cylindrical shaped connector portions can be received over a plurality of receptacles of the connector device, such as by sliding the appendages over pin receptacles of the connector device. In some variations, the produced appendages are configured for arrangement over a center post receptacle of the connector device. Electrodes can be formed for making electrical contact with a plurality of electrodes arranged on the center post receptacle of the connector device.

In some examples, shaping the at least one connector portion includes forming the connector portion into a substantially cylindrical shape configured to be received into a receptacle for an audio or video jack plug connector. A plurality of electrically conductive traces can be formed in or on the flexible circuit substrate. The electrically conductive traces can be formed into electrodes arranged along the length of the substantially cylindrical shape to make electrical contact with electrical conductors in the receptacle of the connector device.

The present systems, devices, and methods can eliminate the need for any additional interface between a receptacle that provides power and flexible electronic circuits. The systems, devices, and methods also allow for an expansion of the types of flexible electronic devices that can be made available and can be made available at reduced cost. The reduced cost allows the flexible electronic devices such as flexible plug-n-play devices to be disposable and to be made biodegradable. This can lead to a new increase the amount and type of flexible electronic devices that be made.

Energy audits can improve the energy efficiency of commercial and residential spaces. During an audit, a number of parameters can be measured and analyzed, for example, power, temperature, occupancy, $CO_2$, lighting, and heating, ventilating, and air conditioning (HVAC) performance of a space, noise level, humidity, and energy use of appliances and building systems.

Energy expenditure on buildings represents approximately forty percent of the primary energy consumed in the United States (about 40 quads in 2010, at a cost of $431B). Heating, cooling, and lighting can account for about half of this energy use. The department of energy (DOE) has estimated that thirty percent of the energy is wasted, and can be recaptured through auditing and efficiency improvements.

Prior art energy audit systems can typically evaluate only single parameter and provide off-line data. Therefore, in those systems more than one device may be required to provide multi-functional capability, which can significantly increase cost. In addition, lack of real-time reporting of energy data is a desirable feature that limits the applicability of these prior art systems. Accordingly, there is a need for low-cost energy audit systems with multi-functional capability, and real-time reporting. The disclosed energy monitor system can perform energy audits and can lead to improvement in the energy efficiency performance of buildings.

The disclosed energy monitor can be used in energy audit and power monitoring applications, which can include, for example, appliance power consumption, local temperature measurement, and light monitoring. In addition to the auditing and monitoring capabilities, the disclosed energy monitors can provide real-time reporting through wireless transmitting of the audited data to a central processing location that can collect information from various energy monitors, aggregate the information, and provide analytic reports. For example, FIG. 15 shows an exemplary implementation of an energy monitor system 1500 in a house with six rooms.

Figure 15:
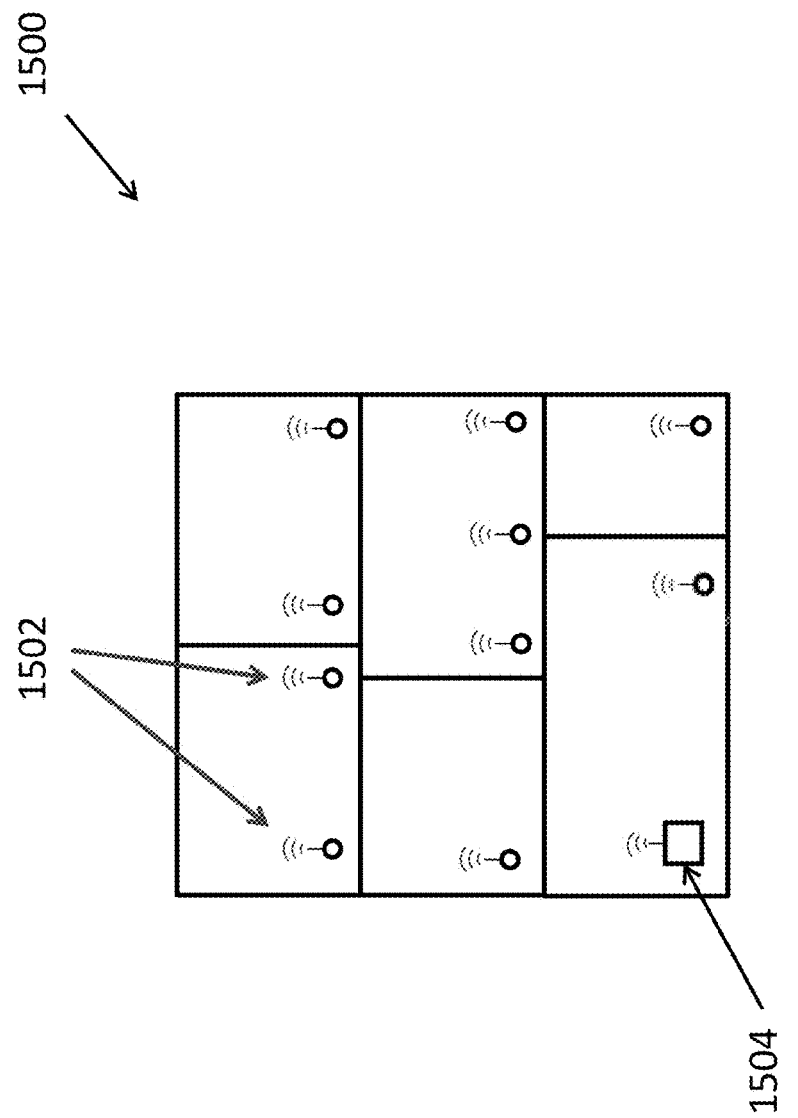
FIG. 15 shows an exemplary energy auditing system, according to aspects of the present disclosure.

Specifically, FIG. 15 shows energy monitors 1502 in the different rooms that can communication wirelessly with a base station 1504 installed in one of the rooms. According to alternative aspects of the disclosure, the disclosed energy monitors can be integrated into appliances and can be used in systems for health monitoring.

As described herein, the energy monitor geometry can allow integration with the power supply and detection of flowing current without necessarily requiring plug connectors or a separate system housing. However, the disclosed energy monitor can also be used in connection with optional plug connectors or a separate system housing. The energy monitor can have a form factor similar to a business or a credit card and can be inserted between a device plug and the wall outlet.

Figure 16A:
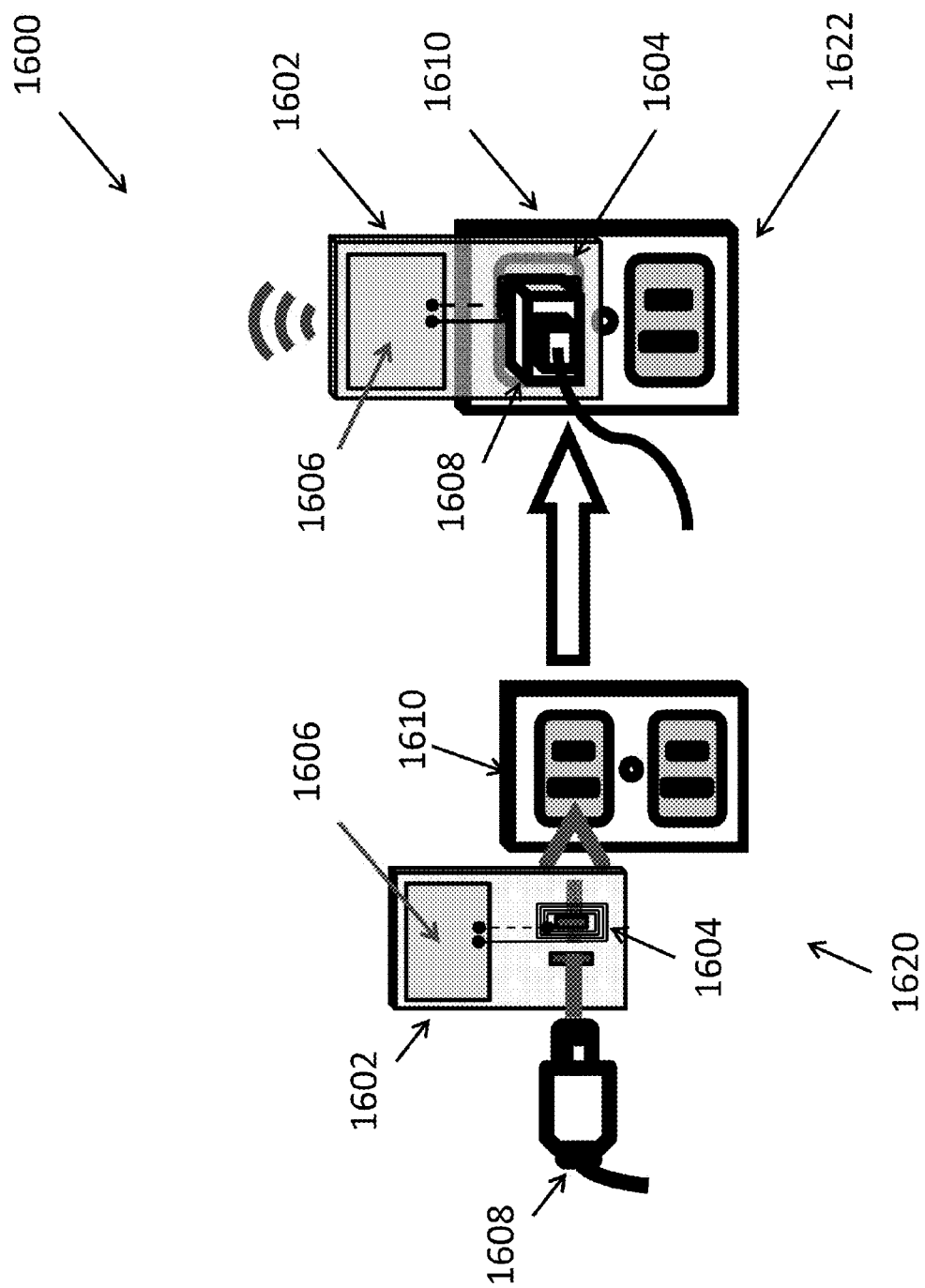
FIGS. 16a-b show exemplary energy monitors, according to aspects of the present disclosure.
Figure 16B:
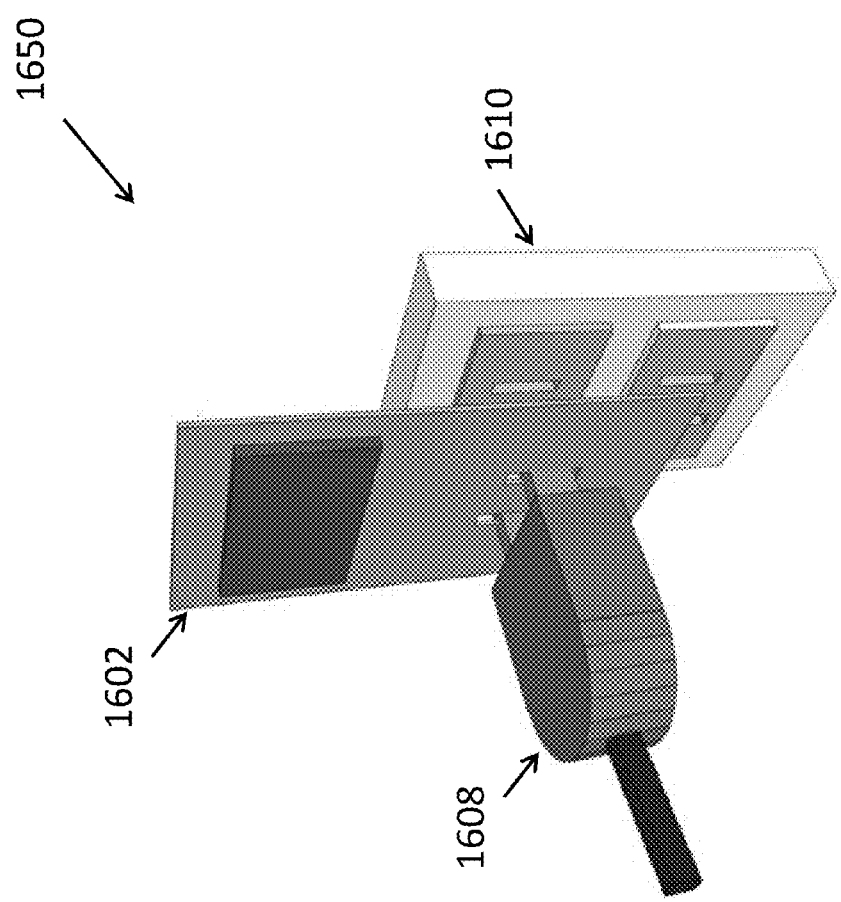

According to aspects of the disclosure, energy monitors can use a circuit board substrate, for example, a flexible circuit board, as both a substrate for circuit integration, e.g., providing mechanical support, and an active part of the circuit connector. The circuit board can be made of standard circuit board materials, for example, FR4, FR2, and polyimide, and standard manufacturing processes can be used. The circuit board can be thin enough to fit between the body of a plug and the receptacle in the wall without affecting the stability of the plug. The plug prongs can pass through holes in the circuit board and directly plug into the socket. The thickness can be small enough to allow the plug to function properly. For example, the thickness can vary from 100 µm, similar to plastic substrate, to 1 mm, similar to typical circuit board thickness. FIG. 16a shows an exemplary implementation 1600 for energy auditing according to aspects of the present disclosure. Specifically, FIG. 16a shows, generally at 1620, energy monitor 1602, with sensing unit 1604 and communication unit 1606, plug 1608, and wall outlet 1610, before plug 1608 is inserted into wall outlet 1610. FIG. 16a also shows, generally at 1622, plug 1608 after it has been inserted into wall outlet 1610, through energy monitor 1602. As further illustrated in FIG. 16b, generally at 1650, energy monitor 1602 has thickness small enough to allow the plug 1608 to be securely inserted into wall plug 1610 and allow, for example, the connected appliance to operate properly.

Figure 17:
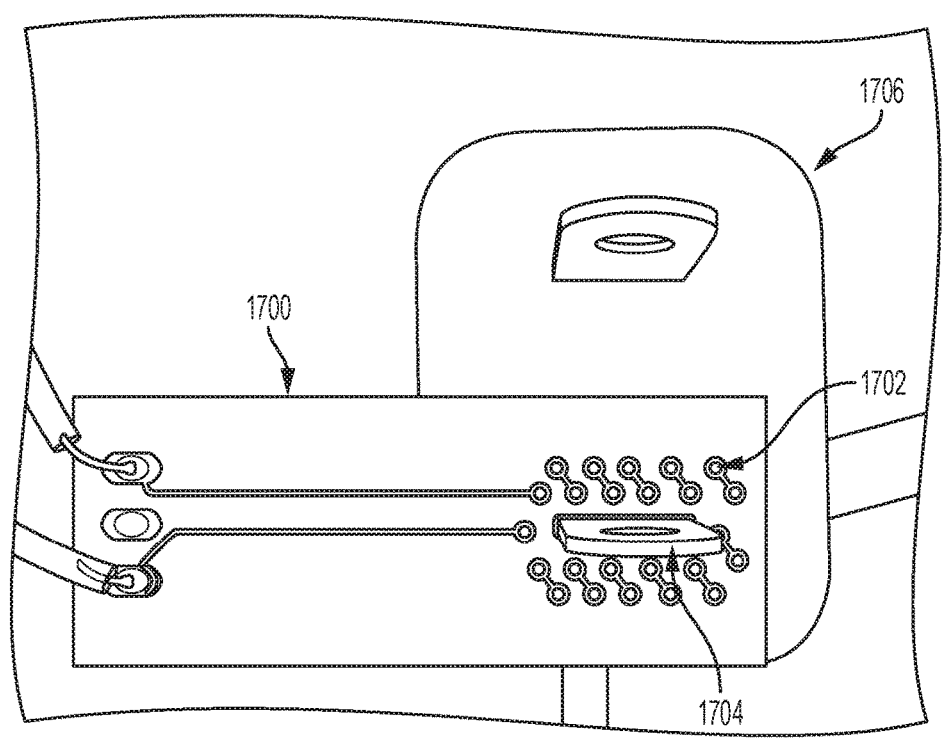
FIG. 17 shows an exemplary sensing unit of an energy monitor, according to aspects of the present disclosure.

FIG. 17 illustrates an exemplary sensor 1700 for power monitoring according to aspects of the invention. Specifically, sensor 1700 can have an integrated inductively coupled coil 1702 wrapping perpendicular to one prong 1704 of plug 1706.

Figure 18A:
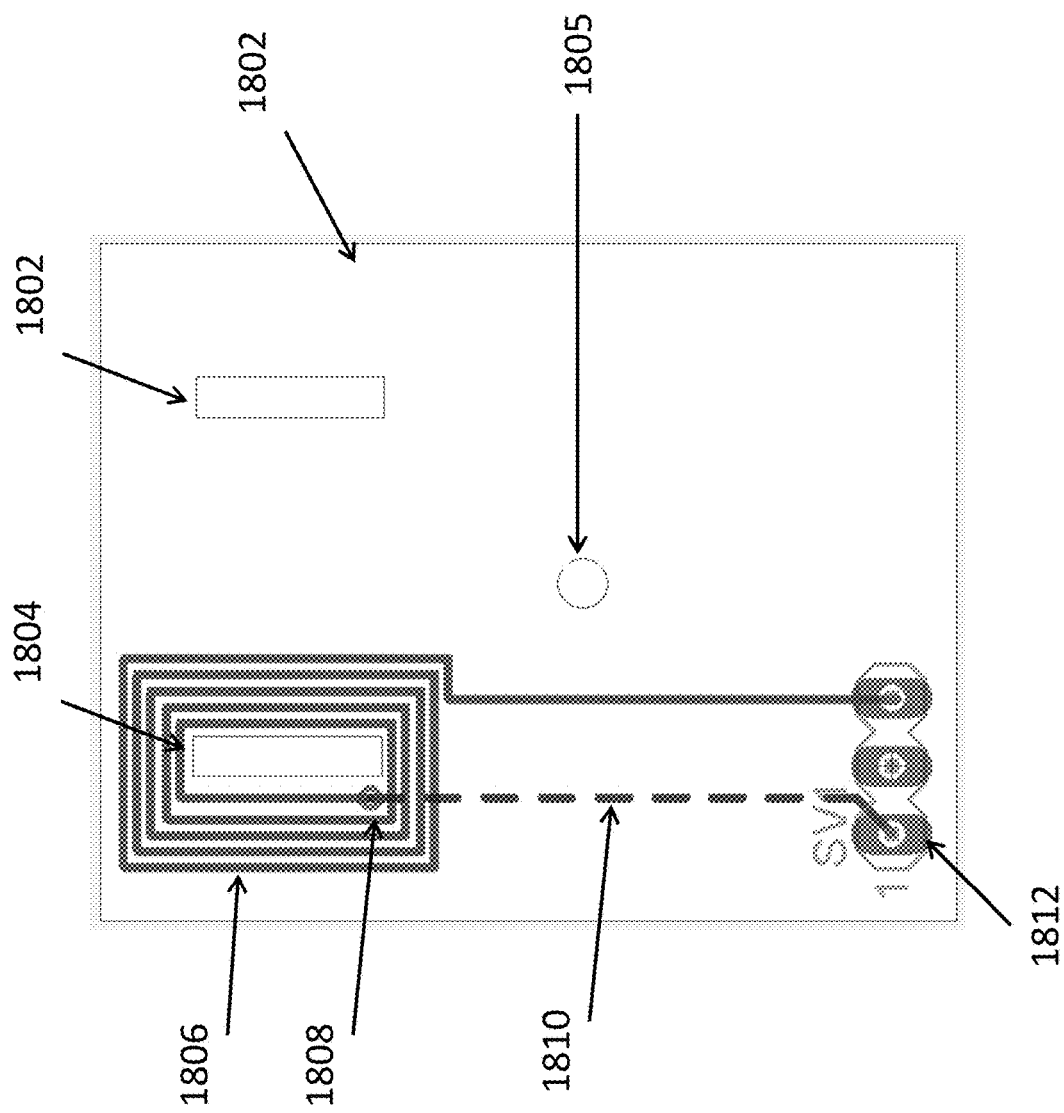
FIGS. 18a-c show exemplary implementations of sensing units of energy monitors, according to aspects of the present disclosure.
Figure 18B:
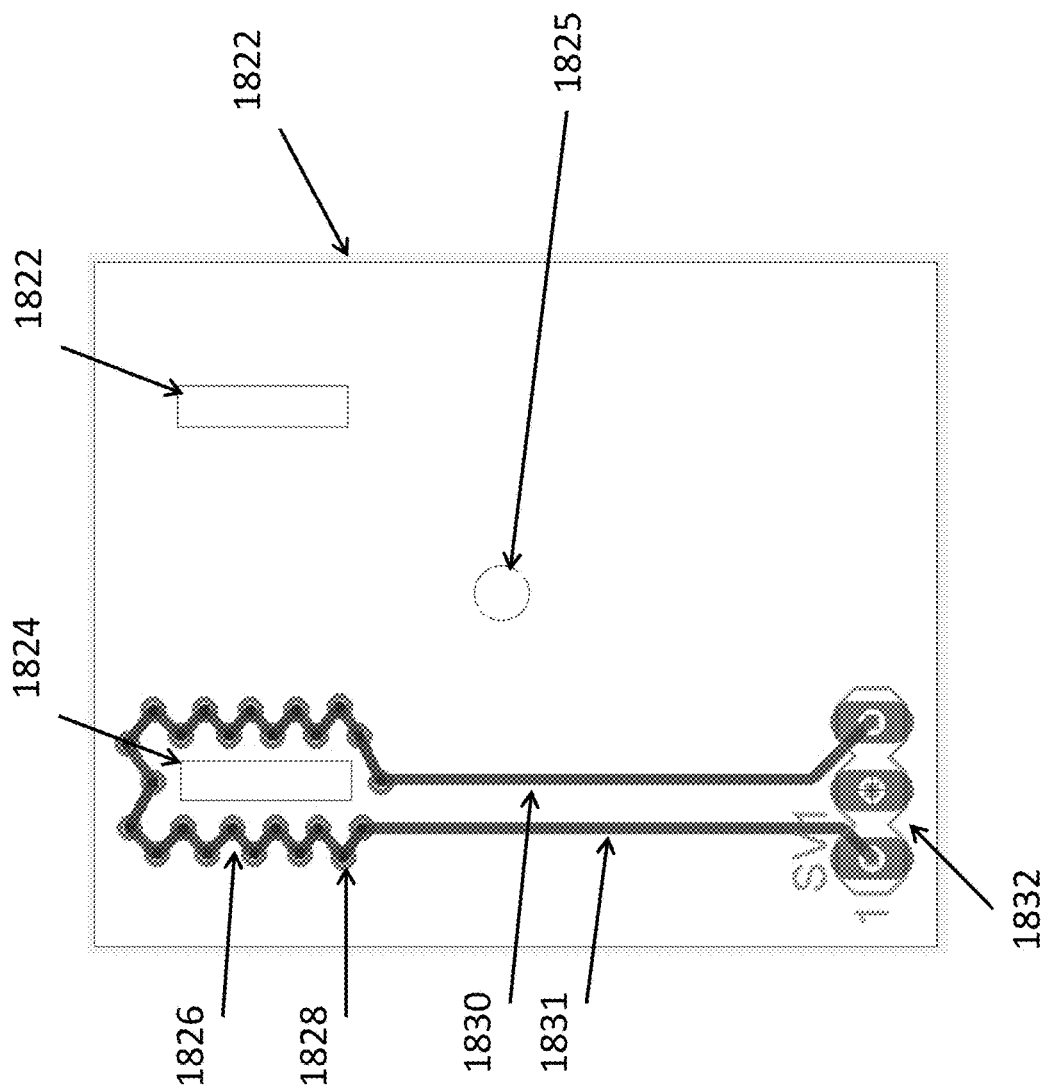
Figure 18C:
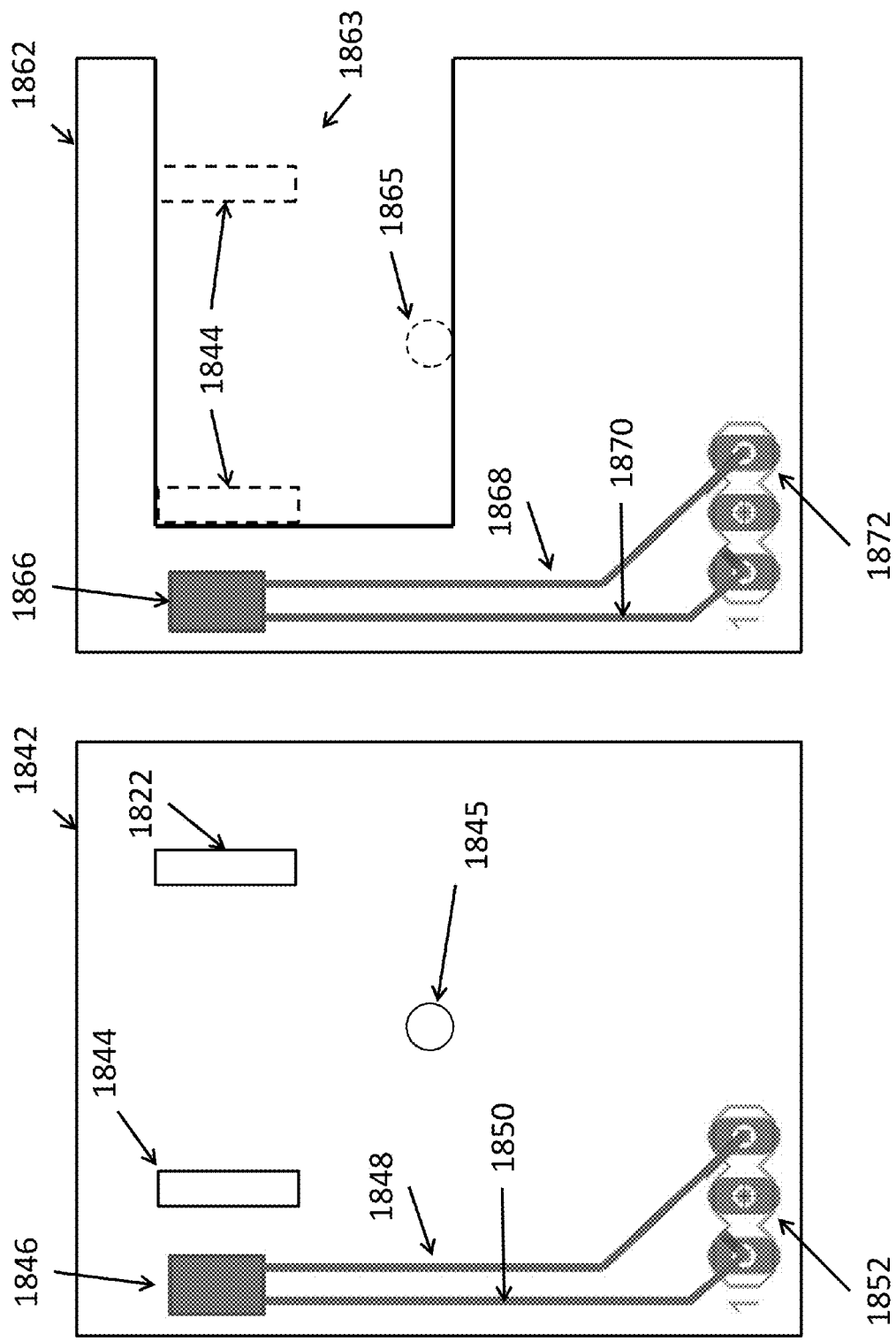

As discussed above, the plug prongs can penetrate through the circuit board of the device. One of the interposers can have a sensor for power monitoring. The sensor can be, for example, an inductively coupled coil or a hall sensor discrete component. For example, the sensing coil can have a planar geometry with a sensing coil wrapping around without touching the plug or a perpendicular geometry with respect to the board with a coil wrapping perpendicular to the plug through VIA holes drilled in the circuit board without touching the plugs. FIGS. 18a-c illustrate schematics of the different types of sensors that can be used in the disclosed energy monitors, according to aspects of the invention. Specifically, FIG. 18a shows a schematic of an exemplary sensor portion of a circuit board, according to aspects of the disclosure. Circuit board 1802 defines holes 1804 for letting prong plugs go through the circuit board. Circuit board 1802 can also optionally define hole 1805 for a ground prong. Integrated inductor 1806 can be formed on a first surface of circuit board 1802, wrapping around one of the holes 1804, such that it does not touch a plug prong, when the plug is inserted to a wall outlet through circuit board 1802. Circuit board 1802 also defines VIA 1808, such that the return path of integrated inductor 1806 is connected to connector 1812. Connector 1812 can connect integrated inductor 1806 to an electronic circuit on a body portion of the circuit board (not displayed).

FIG. 18b shows a schematic of an alternative exemplary sensor portion of a circuit board, according to aspects of the disclosure. Similar to the circuit board of FIG. 18a, circuit board 1822 defines holes 1824 for letting prong plugs go through the circuit board. Circuit board 1822 can also optionally define hole 1825 for a ground prong. Integrated inductor 1826 can be formed through a perpendicular geometry with respect to circuit board 1822 with coil wrapping perpendicular to the plug (or more generally at an angle with respect to the plug) through VIA holes 1828 drilled in circuit board 1822. Integrated inductor 1826 can be formed, such that it does not touch a plug prong, when the plug is inserted to a wall outlet through circuit board 1822. Forward path 1830 and return path 1831 of integrated inductor 1826 are connected to connector 1832. Connector 1832 can connect integrated inductor 1826 to an electronic circuit on a body portion of the circuit board (not displayed).

FIG. 18c shows schematics of alternative exemplary sensor portions of two circuit boards, according to aspects of the disclosure. Circuit board 1842 defines holes 1844 for letting prong plugs go through the circuit board. Circuit board 1842 can also optionally define hole 1845 for a ground prong. Circuit board 1842 can include hall sensor 1846 on a first surface of circuit board 1842 near one of holes 1844. Forward path 1848 and return path 1850 can connect hall sensor 1848 to connector 1852. Connector 1852 can connect hall sensor 1846 to an electronic circuit on a body portion of the circuit board (not displayed).

Also shown in FIG. 18c, circuit board 1862 can be shaped such that opening 1863 has dimensions that can allow circuit board 1862 to be secured to a wall outlet when circuit board is inserted between a wall outlet and a plug. For example, opening 1863 can have dimensions such that a top side 1863a of opening 1863 can touch a top side of prongs 1864, a botting side 1863b of opening 1863 can touch ground prong 1865, and 1863c can touch one of prongs 1864, when a plug is inserted into a wall outlet through circuit board 1862. Circuit board 1862 can include hall sensor 1866 on a first surface of circuit board 1862. Forward path 1868 and return path 1870 can connect hall sensor 1868 to connector 1872. Connector 1872 can connect hall sensor 1866 to an electronic circuit on a body portion of the circuit board (not displayed).

According to alternate aspects of the disclosure, the circuit board can alternatively be fabricated using flexible circuit process. Furthermore, the device can be a hybrid structure with both standard circuit portion and flexible circuit portion, for example, standard circuit for the communication portion of the energy monitor and flexible circuit for the sensor portion.

The disclosed system can achieve cost savings, for example, because multiple parameters of interest for energy monitoring can be implemented on the same energy monitor and can share the same radio and control system. The addition of other sensing modalities can add only little cost to the overall system, and the cost of the radio can be amortized over several measurement modalities, compared to an implementation that uses separate monitors for each sensed modality. Moreover, the use of a substrate-integrated connector system can eliminate the need for separate connectors, and, therefore, can further decrease the bill of materials cost.

According to aspects of the disclosure, the energy monitor can use standards-compliant low-cost radio equipment, for example, for the hub and access units, which can eliminate the need for expensive base or bridge stations. For example, the energy monitor can include circuits for implementing the Bluetooth or Zigbee standards for the wireless transmission of the audited information. In addition, in a system that includes multiple energy monitors, a mesh network can be formed.

The disclosed energy monitor can access at least one prong of the plug to enable non-contact measurement of the current flowing through a plug, for example, the current used by an appliance, without interfering with the current path or requiring disassembly of the cabling to achieve an accurate measurement.

According to aspects of the disclosure, the energy monitor can draw power from the wall outlet or alternatively can be battery powered, or it can receive power from other sources. Because the energy monitor can operate under minimum energy requirements, the power drawn from the wall outlet would be an insignificant amount, compared to the measured power. Therefore, it will not affect the accuracy of the power measurement. Similarly, if the energy monitor is battery powered, there will not be a need to frequently replace the battery.

FIGS. 19A-B illustrate an exemplary implementation of an energy monitor that can draw power from the wall outlet through the plug prongs. Specifically, FIG. 19A shows a front face view 1900 of the sensor portion 1902 of the energy monitor. The sensor portion has holes 1904 to allow two plug prongs to go through the energy monitor. Adjacent to holes 1904, the sensor portion has two flexible connector plates 1906 that can bend when the plug prongs are inserted through the energy monitor. This is illustrated in FIG. 19B, which shows a top view 1950 of sensor portion 1902. When the plug prongs 1952 go through sensor portion 1902, flexible connector plates 1906 bend towards the side of the wall outlet and provide electrical connection between the wall outlet and the energy monitor. The energy monitor can therefore be powered without an energy source installed in the energy monitor.

According to alternative embodiments, the energy monitor can additionally have a battery, for example, a rechargeable battery that can be charged when flexible connector plates 1906 provide power to the energy monitor.

FIG. 20 shows an exemplary method 2000 for making an apparatus for energy monitoring, according to aspects of the disclosure. Specifically, the method can include providing a circuit substrate (step 2002). The method can also include defining a first opening on a sensor portion of the circuit substrate (step 2004) and providing an integrated inductor on the sensor portion around the first opening (step 2006). The method can further include providing an electronic circuit on a body portion of the circuit substrate electrically coupled to the integrated inductor (step 2008) and can also include wirelessly transmitting information to a wireless receiver (2010).

As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

What is claimed is:

1. An apparatus comprising:
   a sensor portion on a circuit substrate, the sensor portion defining a first opening;
   an integrated inductor on the sensor portion, the integrated inductor being formed proximal to the first opening; and
   an electronic circuit on a body portion of the circuit substrate electrically coupled to the integrated inductor and configured to wirelessly transmit information to a wireless receiver;
   wherein the integrated inductor is formed by wrapping a coil proximal to the first opening partially on a first surface of the circuit substrate and partially on a second surface of the circuit.

2. The apparatus of claim 1, wherein the integrated inductor is formed by wrapping a coil on a first surface of the circuit substrate around the first opening.

3. The apparatus of claim 2, wherein the integrated inductor has a planar geometry.

4. The apparatus of claim 1, wherein a first part of the coil on the first surface is connected to a first part of the coil on the second surface through a hole in the circuit substrate.

5. The apparatus of claim 1, wherein the first opening is defined to allow a first plug prong to fit through the first opening.

6. The apparatus of claim 5, wherein the sensor portion further defines a second opening, wherein the second opening is defined to allow a second plug prong to fit through the second opening.

7. The apparatus of claim 6, wherein the sensor portion further defines a third opening, wherein the third opening is defined to allow a third plug prong to fit through the third opening.

8. The apparatus of claim 1, wherein a thickness of the sensor portion is sufficiently small as to allow a plug to be securely inserted into a wall outlet through the first opening and a second opening defined on the sensor portion.

9. The apparatus of claim 8, wherein the integrated inductor is capable of sensing an amount of current flowing through a first plug prong when the plug is inserted into the wall outlet.

10. A method for making an energy audit apparatus comprising:
    providing a sensor portion on a circuit substrate, the sensor portion defining a first opening;
    forming an integrated inductor on the sensor portion proximal to the first opening; and
    providing an electronic circuit on a body portion of the circuit substrate electrically coupled to the integrated inductor and configured to wirelessly transmit information to a wireless receiver;
    wherein the integrated inductor is formed by wrapping a coil proximal to the first opening partially on a first surface of the circuit substrate and partially on a second surface of the circuit.

11. The method of claim 10, wherein the integrated inductor is formed by wrapping a coil on a first surface of the circuit substrate around the first opening.

12. The method of claim 11, wherein the integrated inductor has a planar geometry.

13. The method of claim 10, further comprising connecting a first part of the coil on the first surface to a first part of the coil on the second surface through a hole in the circuit substrate.

14. The method of claim 10, wherein the first opening is defined to allow a first plug prong to fit through the first opening.

15. The method of claim 14, wherein the sensor portion further defines a second opening, wherein the second opening is defined to allow a second plug prong to fit through the second opening.

16. The method of claim 15, wherein the sensor portion further defines a third opening, wherein the third opening is defined to allow a third plug prong to fit through the third opening.

17. The method of claim 10, wherein a thickness of the sensor portion is sufficiently small as to allow a plug to be securely inserted into a wall outlet through the first opening and a second opening defined on the sensor portion.

18. The method of claim 17, wherein the integrated inductor is capable of sensing an amount of current flowing through a first plug prong when the plug is inserted into the wall outlet.

19. A system for energy auditing comprising:
a plurality of energy auditing devices, each energy auditing devices comprising:
  a sensor portion on a circuit substrate, the sensor portion defining a first opening;
  an integrated inductor on the sensor portion, the integrated inductor being formed proximal to the first opening, wherein the integrated inductor is formed by wrapping a coil proximal to the first opening partially on a first surface of the circuit substrate and partially on a second surface of the circuit; and
  an electronic circuit on a body portion of the circuit substrate electrically coupled to the integrated inductor and configured to wirelessly transmit information to a wireless receiver; and
a base station configured to:
  receive the information from at least one energy auditing device; and
  analyze the received information to provide an energy audit.

* * * * *